United States Patent
DeYoung

(10) Patent No.: US 7,998,875 B2
(45) Date of Patent: Aug. 16, 2011

(54) VAPOR PHASE REPAIR AND PORE SEALING OF LOW-K DIELECTRIC MATERIALS

(75) Inventor: James DeYoung, Dallas, TX (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/746,807

(22) PCT Filed: Dec. 8, 2008

(86) PCT No.: PCT/US2008/013471
§ 371 (c)(1),
(2), (4) Date: Sep. 20, 2010

(87) PCT Pub. No.: WO2009/085098
PCT Pub. Date: Jul. 9, 2009

(65) Prior Publication Data
US 2011/0020955 A1   Jan. 27, 2011

Related U.S. Application Data

(60) Provisional application No. 61/008,148, filed on Dec. 19, 2007.

(51) Int. Cl.
H01L 21/302 (2006.01)

(52) U.S. Cl. ........ 438/725; 438/780; 438/781; 257/642; 257/E21.211; 257/E21.212; 257/E21.214; 257/E21.241

(58) Field of Classification Search .................. 438/637, 438/638, 700, 725, 780, 781; 427/140, 337, 427/532; 257/642, 643, E21.211, E21.212, 257/E21.214, E21.241
See application file for complete search history.

(56) References Cited

U.S. PATENT DOCUMENTS

| 6,455,130 B1 | 9/2002 | Wallace et al. |
| 6,495,479 B1 | 12/2002 | Wu et al. |
| 6,670,022 B1 | 12/2003 | Wallace et al. |
| 2007/0298163 A1 | 12/2007 | DeYoung |

OTHER PUBLICATIONS

International Search Report and Written Opinion mailed Mar. 27, 2009 for PCT/US2008/013471.

*Primary Examiner* — Hsien-ming Lee
(74) *Attorney, Agent, or Firm* — Buchanan Ingersoll & Rooney PC

(57) ABSTRACT

A method of treating a nanoporous low-k dielectric material formed on a semiconductor substrate is provided. The low-k dielectric material has etched openings with an etch damaged region containing silanol groups on exterior surfaces of the etched openings and on interior surfaces of interconnected pores. First, the low-k dielectric material is contacted with a vapor phase catalyst in an amount effective to form hydrogen bonds between the catalyst and the silanol groups in the etch damaged region, forming a catalytic intermediary. Second, the low-k dielectric material is contacted with a vapor phase alkoxysilane repair agent in an amount effective to react with about 50% or more of the silanol groups in the etch damaged region, such that the alkoxysilane repair agent reacts with the catalytic intermediary; and/or the low-k dielectric material is contacted with a vapor phase alkoxysilane sealing agent in an amount effective to prevent diffusion of an overlying barrier layer into the interconnected pores, such that the alkoxysilane sealing agent reacts with the catalytic intermediary.

20 Claims, 9 Drawing Sheets

PRIOR ART

REACTING SURFACE-BOUND Si-OH GROUPS AND
FORMING A HORIZONTAL NETWORK

Damage ~ 43 nm/side

Damage ~ 11 nm/side

Damage ~ 11 nm/side

VAPOR PHASE REPAIR AND PORE SEALING OF LOW-K DIELECTRIC MATERIALS

This application is a national stage application under 35 USC §371 of International Application Number PCT/US2008/013471, filed Dec. 8, 2008, the international application being published in English. This application also claims priority under 35 USC §119 to U.S. Provisional Application No. 61/008,148, filed Dec. 19, 2007, the entire content of which is hereby incorporated by reference.

BACKGROUND

As the dimensions of integrated circuit devices continue to decrease, the time delay for the propagation of a signal between multiple transistors (i.e., propagation delay) has become an increasingly important parameter in determining device performance. Propagation delay is proportional to the product of the resistance of a metal interconnect line (R) and the capacitance of the interlevel dielectric insulation material (C) (also referred to as RC delay). Thus, to minimize propagation delay, it is beneficial to incorporate an insulating material with a low dielectric constant material in combination with a high conductivity metal (or low resistivity metal). Low-k dielectric (LKD) materials (k<3.0), such as organosilicate glass (OSG), organosilicate glass (OSG), tetraethylorthosilicate (TEOS), fluorinated silica glass (FSG) and carbon-doped oxides, are also gaining interest as alternatives to silicon oxide (k=3.8-4.0). To obtain lower dielectric values, the LKD material can contain an interconnected nanoporous structure, which entraps air (k=1) to lower the overall k value of the bulk LKD. Likewise, copper (Cu) has gained considerable interest as a metal for interconnect lines, as an alternative to the more conventional aluminum (Al) interconnect metal (R=3.0-5.0 $\mu\Omega$-cm), because of its lower resistivity value (R<2 $\mu\Omega$-cm).

Because copper does not readily form volatile by-products, conventional or subtractive etching techniques are inadequate. Thus, damascene manufacturing processes are necessary to form patterned copper interconnect lines, processes that involve depositing conductive material in previously patterned openings (e.g., trenches or vias). Thus, damascene processing necessitates the etching of previously patterned openings in the LKD material. This is performed by patterning openings in a mask layer, such as photoresist, on a dielectric layer in the shape of a trench or via, followed by wet or dry etching. However, the etching, ashing or cleaning of LKD materials can potentially damage the LKD material.

SUMMARY

A method of treating a nanoporous low-k dielectric material formed on a semiconductor substrate is provided. The low-k dielectric material has etched openings with an etch damaged region containing silanol groups on exterior surfaces of the etched openings and on interior surfaces of interconnected pores. First, the low-k dielectric material is contacted with a vapor phase catalyst in an amount effective to form hydrogen bonds between the catalyst and the silanol groups in the etch damaged region, forming a catalytic intermediary. Second, the low-k dielectric material is contacted with a vapor phase alkoxysilane repair agent in an amount effective to react with about 50% or more of the silanol groups in the etch damaged region, such that the alkoxysilane repair agent reacts with the catalytic intermediary; and/or the low-k dielectric material is contacted with a vapor phase alkoxysilane sealing agent in an amount effective to prevent diffusion of an overlying barrier layer into the interconnected pores, such that the alkoxysilane sealing agent reacts with the catalytic intermediary.

In another embodiment, a method of treating a nanoporous low-k dielectric material formed on a semiconductor substrate is provided. The low-k dielectric material has etched openings with an etch damaged region containing silanol groups on exterior surfaces of the etched openings and on interior surfaces of interconnected pores. First, the low-k dielectric material is contacted with a vapor phase organic acid catalyst in an amount effective to form hydrogen bonds between the catalyst and the silanol groups in the etch damaged region, forming a catalytic intermediary. Second, the low-k dielectric material is contacted with a vapor phase alkoxysilane repair agent in an amount effective to react with about 50% or more of the silanol groups in the etch damaged region, such that the alkoxysilane repair agent reacts with the catalytic intermediary; and/or the low-k dielectric material is contacted with a vapor phase alkoxysilane sealing agent in an amount effective to prevent diffusion of an overlying barrier layer into the interconnected pores, such that the alkoxysilane sealing agent reacts with the catalytic intermediary.

DETAILED DESCRIPTION

Figure 1A:
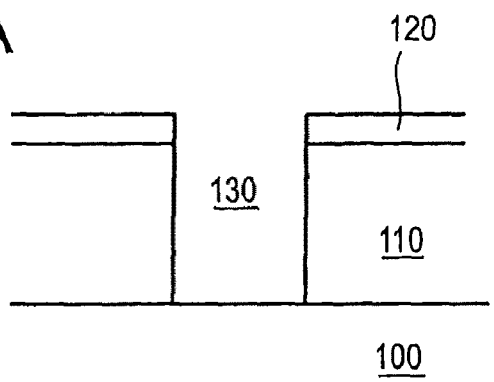
FIG. 1 illustrates an exemplary embodiment of a damascene manufacturing process.

FIG. 1 is an exemplary embodiment of a damascene manufacturing process. FIG. 1A illustrates a semiconductor substrate 100 with an overlying nanoporous LKD material layer 110. Using mask layer 120, openings 130 are formed in nanoporous LKD material 110. For illustration purposes, only one opening 130 is shown, which can be one of many vias or trenches. For example, mask layer 120 can be an organic photoresist and opening 130 can be formed by plasma etching. Upon the completion of plasma etching, mask layer 120 can be removed by ashing (i.e., dry etching in an oxygen-based plasma).

Figure 1B:
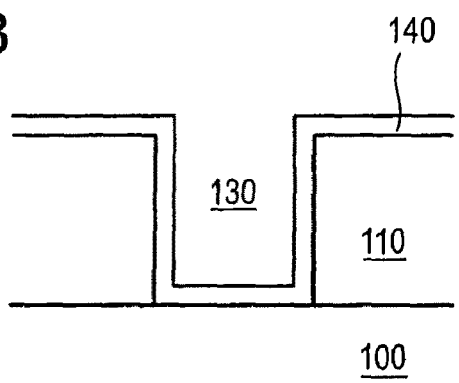

In FIG. 1B, barrier layer 140 can be formed over the sidewall and bottom surfaces of opening 130 to protect the nanoporous LKD material 110 adjacent to the copper interconnects from being poisoned by copper atoms diffusing into the adjacent dielectric material. Exemplary barrier materials include titanium (Ti), titanium nitride (TiN), tantalum (Ta), tantalum nitride (TaN), ruthenium (Ru), ruthenium oxide ($RuO_x$) and alloys thereof. For example, the barrier material can be coated by physical vapor deposition (PVD), atomic layer deposition (ALD), or the like.

Figure 1C:
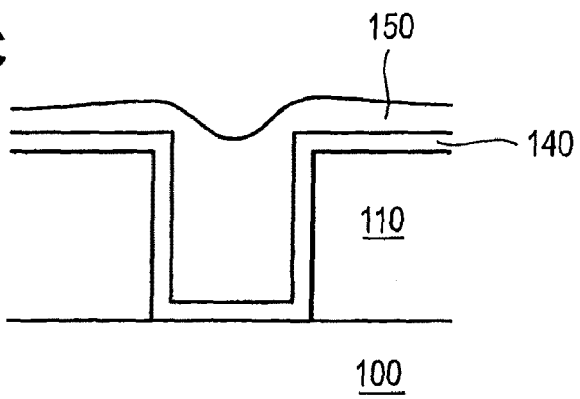
Figure 1D:
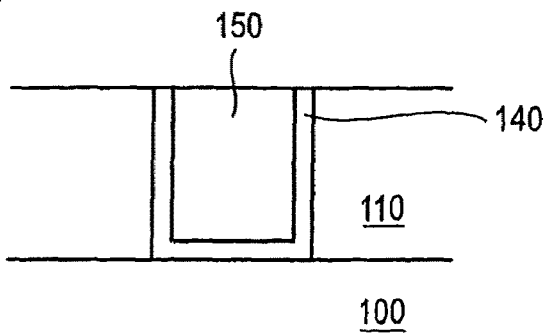

In FIG. 1C, opening 130 is filled with bulk copper layer 150. For example, bulk copper layer 150 can be formed by depositing a seed layer, followed by electroless copper plating. As illustrated in FIG. 1D, the structure is planarized to remove the excess portion of bulk copper layer 150 by any suitable technique such as chemical mechanical planarization (CMP).

The damascene manufacturing process can either be a single or double damascene process. For the latter process, either the via-first approach or the trench-first approach can be used.

Prior to the successful implementation of nanoporous LKD material in a damascene structure, several obstacles must be overcome. First, the process of forming openings 130 (e.g., vias or trenches) by etching and removal of mask layer 120 by ashing can potentially damage the nanoporous LKD material. Second, the barrier material 140 (e.g., Ti, TiN, Ta, TaN, Ru or $RuO_x$) can potential penetrate into interconnecting pores of nanoporous LKD material 110, compromising the low dielectric value. Third, due to the presence of interconnecting pores in many nanoporous LKD materials, structures formed from nanoporous LKD material may lack mechanical strength for subsequent processing steps (e.g., CMP). Thus, a need exists to repair damaged nanoporous LKD materials, sealing the surfaces of opening 130, as well as enhancing the mechanical strength of LKD materials.

During plasma etching and ashing, at least a portion of carbon containing moieties (i.e., methyl or —$CH_3$ groups) can be removed, resulting in nanoporous LKD materials having reduced hydrophobicity. When the carbon containing moieties are removed from the nanoporous LKD materials, Si—C bonds are replaced with Si—OH ("silanol") bonds or groups and the resulting dielectric layer loses its hydrophobicity as water molecules from the atmosphere or from subsequent wet cleaning steps form strong hydrogen-bonding interactions with the silanol groups. The presence of water, which has a k-value of about 70, results in a significant increase in the k-value of the nanoporous LKD material. For example, during the plasma etching of openings (e.g., vias or trenches) in the nanoporous LKD material, plasma damage can extend to a depth of about 30 nm into the sidewalls of the openings. At a depth of about 5 nm into the plasma damaged nanoporous LKD material, about 25% of methyl groups (—$CH_3$) are lost (i.e., 25% of the Si—C bonds are replaced with Si—OH bonds or groups).

Figure 2:
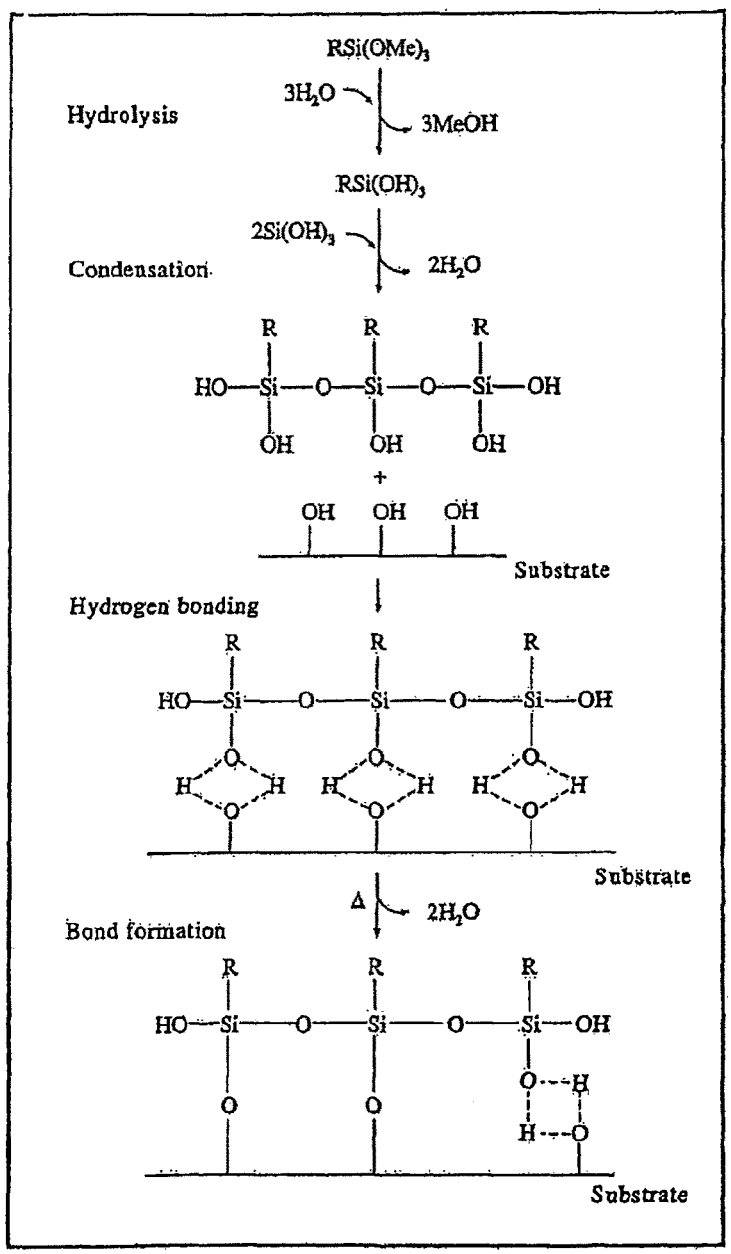
FIG. 2 illustrates the hydrolytic deposition of silanes.

Etch damaged nanoporous LKD materials can be treated with alkoxysilane agents, which react with the Si—OH. However, one drawback of using alkoxysilane agents is that water is required to hydrolyze the alkoxy groups prior to condensation with the surface-bound Si—OH groups in a condensation step. Thus, one of the challenges associated with the use of compounds such as alkoxysilane agents is the consistency of repair. This relates to the key role water plays in the chemical reaction between the alkoxysilanes and the Si—OH groups. As illustrated in FIG. 2, water is needed to hydrolyze the alkoxy groups prior to condensation with the Si—OH groups in a hydrolysis step.

Differing levels of hydrogen-bonded water on surfaces, driven by atmospheric moisture, directly affect reaction efficiency. Without the use of catalysts, the chemical reaction between the alkoxysilanes and the Si—OH groups mandates the presence of some water. Further, if a consistent result is desired, substantially the same level of hydration has to be maintained from sample to sample.

Figure 3:
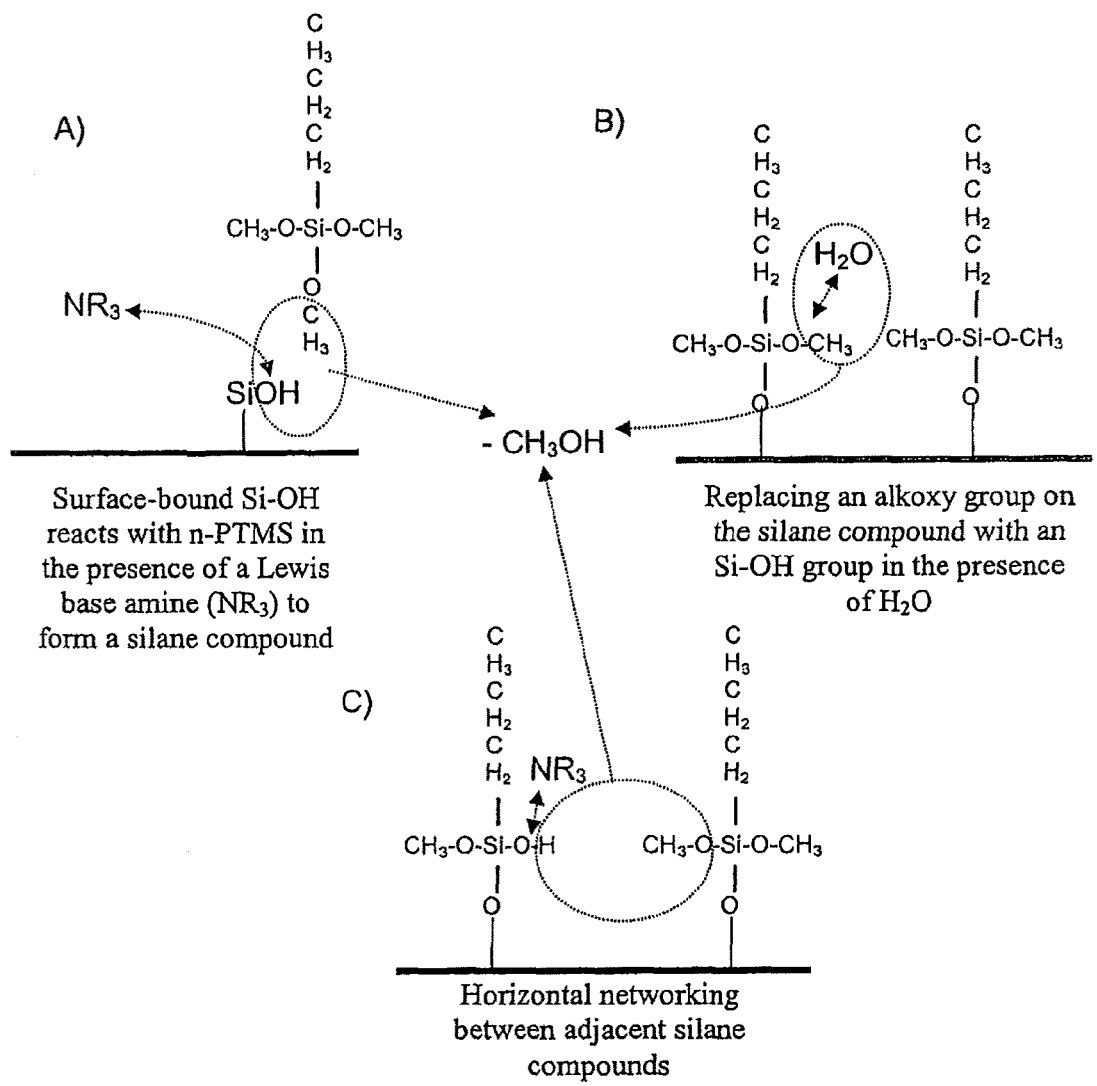
FIG. 3A illustrates a reaction between surface-bound Si—OH groups and n-propyl trimethoxysilane (n-PTMS) in the presence of a Lewis base amine to form silane compounds.
FIG. 3B illustrates the conversion of an alkoxy group into an Si—OH group.
FIG. 3C illustrates the formation of a horizontal network between adjacent silane compounds.

Lewis base amines (e.g., ammonia, methyl amine, dimethyl amine or trimethyl amine) can be used as catalysts to enhance the rate of condensation between alkoxysilanes and Si—OH groups without the hydrolysis step. As illustrated in FIG. 3, the Lewis base amines serve as a catalyst by forming a catalytic intermediary with the Si—OH groups. The catalytic intermediary is formed because a hydrogen bond is developed between the Lewis base amine and the Si—OH group. The formation of this hydrogen bond drives the reaction forward, allowing the direct reaction of a Si—OH group with a alkoxy group of the alkoxysilane agent. The catalytic intermediary is itself highly susceptible to reaction with the alkoxysilane agent. The reaction produces the corresponding alcohol as a byproduct and the amine is freed to again hydrogen bond with additional Si—OH groups. Additionally, the alkoxysilane compounds can be horizontally networked to form three-dimensional horizontally networked structures, restoring the mechanical strength of the nanoporous LKD material.

Figure 4:
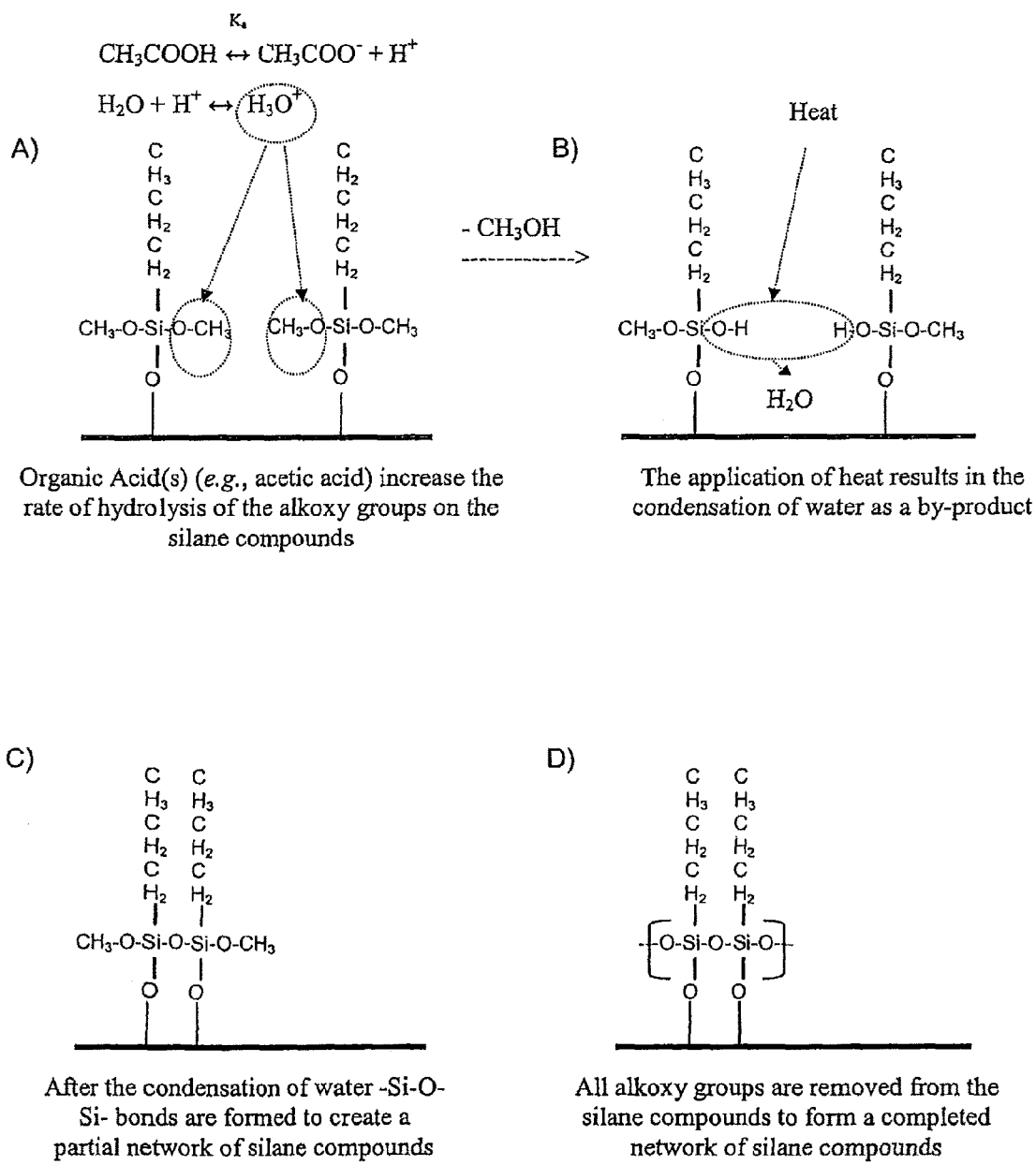
FIGS. 4A-4D illustrate the formation of a horizontal network between adjacent silane compounds in the presence of an organic acid.

Organic acids can also be used as catalysts by hydrolyzing alkoxysilanes to form Si—OH groups, which condense with surface-bound Si—OH groups in the presence of heat. Additionally, as illustrated in FIG. 4, organic acids can be used to catalyze the reaction between water and substantially most of the residual alkoxy groups remaining on the repaired and/or horizontally networked nanoporous LKD material. In FIG. 4A, organic acids catalyze a hydrolytic reaction between water and the residual alkoxy groups, which produces Si—OH groups as shown in FIG. 4B. In FIG. 4C, Si—OH groups of adjacent silane compounds are then condensed to form the horizontal network. The organic acid can be any organic acid having a $pK_a$ of up to about 7, more preferably up to about 4, and most preferably up to about 3. The organic acids can include acetic acid, trifluoroacetic acid, trichloroacetic acid, citric acid, other fully halogenated or partially halogenated weak acids, and various combinations thereof.

Such Lewis base amine and organic acid catalysts have been demonstrated to kinetically enhance the rate of condensation between alkoxysilanes and surface-bound Si—OH groups without the primary hydrolysis step in a supercritical $CO_2$ (or $SCCO_2$) medium, as disclosed in commonly-assigned U.S. patent application Ser. No. 11/475,206, which is incorporated by reference in its entirety.

Described herein is a novel method of repairing and/or sealing etch damaged nanoporous LKD material using vapor-phase mono-, di- or tri-functional alkoxysilane agents coupled with vapor-phase Lewis base amine or organic acid catalysts. Repair agents and sealing agents can be generically represented as Si—$(R)_x(OR')_y$, where $y \geq 1$, $x+y=4$, R is an alkyl, aryl or hydroxyl group and R' is an alkyl or aryl group, preferably methyl or ethyl.

Alkoxysilane repair agents can be characterized by smaller sized molecules, about 80 to about 125 atomic mass units (AMU) that can diffuse into the bulk of the nanoporous LKD materials via the interconnected porous network and react with silanol groups. Upon the completion of repair, 50% or more of the lost methyl groups are replenished with an alkyl group (e.g., ethyl, propyl, butyl groups), preferably about 75% to about 90% of the methyl groups are replenished.

Examples of repair agents can include methyl trimethoxysilane ($CH_3$—Si—(O—$CH_3$)$_3$), dimethoxy dimethylsilane (($CH_3$)$_2$—Si—($OCH_3$)$_2$), methoxy trimethylsilane (($CH_3$)$_3$—Si—$OCH_3$) or n-propyl trimethoxysilane ($CH_3$—$CH_2$—$CH_2$—Si—($OCH_3$)$_3$ or n-PTMS).

Alkoxysilane sealing agents can be characterized by larger sized molecules, from about 200 to about 400 AMU. Pore sealing of the nanoporous LKD material operates by the principal of size exclusion, in which the larger size of the alkoxysilane sealing agent has a reactive collision with a surface-bound Si—OH group, rather that passing through a pore opening of the nanoporous LKD material into a porous network. Alkoxysilane sealing agents react with surface silanol groups at a depth of less than about 3 to 4 nm, preferably at a depth of about 1 to 2 nm. Upon completion of the sealing process, the sidewall and bottom surfaces of the opening are covered with a film with a thickness of up to about 2 nm. This film is effective to prevent the diffusion of overlying barrier materials into the interconnected pores of the nanoporous LKD material, however, it should be noted that vapor-phased catalysts can continue to diffuse into the nanoporous LKD material, due to their smaller molecular size.

Examples of sealing agents can include bis(dimethoxymethyl)siloxane, bis(methyldimethyloxysilylpropyl)-N-methylamine, bis(triethoxysilyl)ethane, 1,2-bis(trimethoxysilyl)hexane, bis(trimethoxysilylpropyl)amine or bis(3-triethoxysilyl)propyl)disulfide.

Figure 5A:
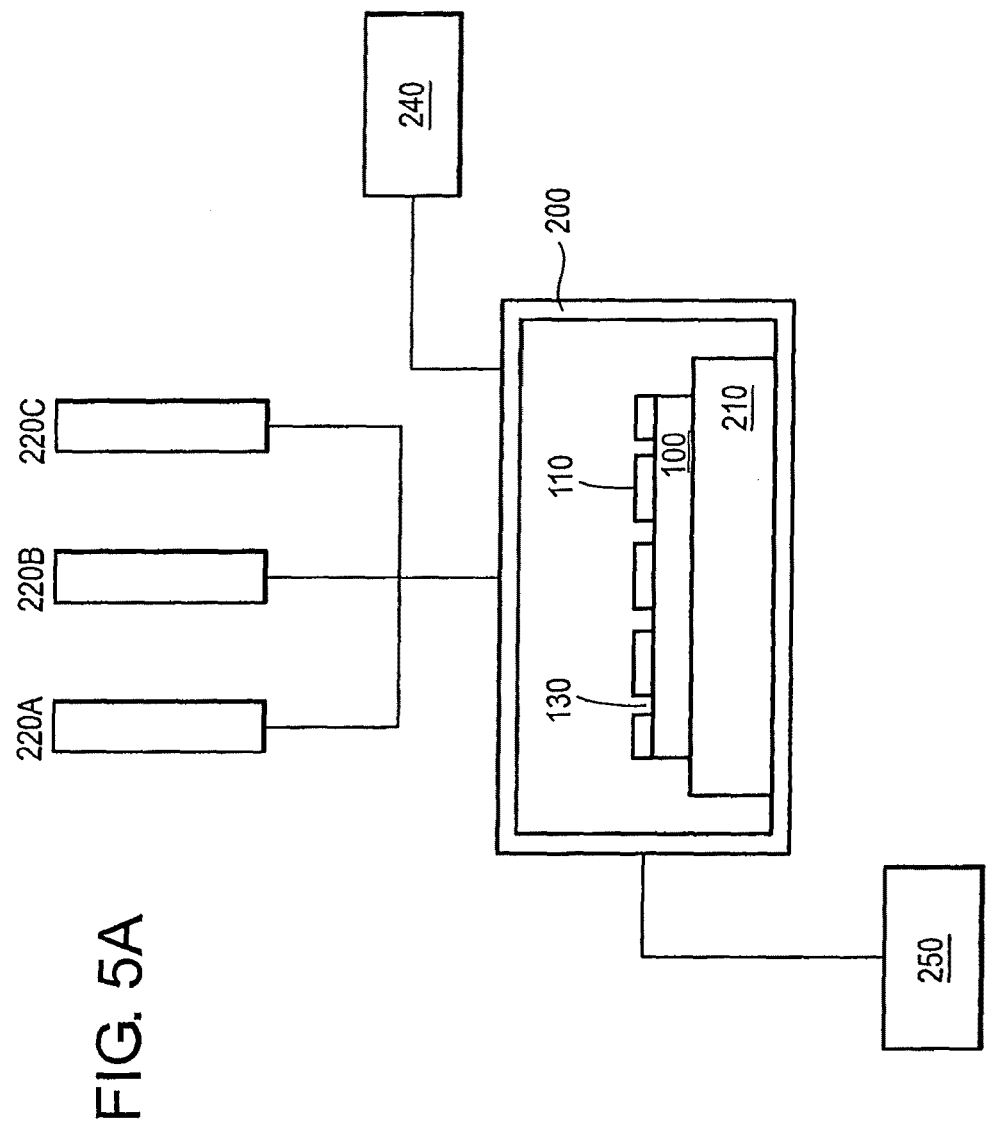
FIG. 5A illustrates a process chamber and chemical vapor delivery system for repairing and/or sealing semiconductor substrate with a nanoporous LKD material.

As illustrated in FIG. 5A, semiconductor substrate 100 with a nanoporous LKD material 110 is placed in process chamber 200 for the treatment of damage resulting from etching and/or photoresist ashing. Process chamber 200 can be operational at pressures from about 1 mTorr to about 3750 Torr (i.e., about 5 bars) and at temperatures up to about 300° C.

Nanoporous LKD material 110 includes previously etched openings 130 (e.g., trenches or vias). Due to previous etching and/or removal of an overlying mask layer, the exposed surfaces of dielectric layer 110 are etch damaged. Although not illustrated in FIG. 5A, nanoporous LKD material 110 can overlie an intermediate layer such as a barrier layer and a conductive or semiconductive layer.

Examples of nanoporous LKD material can include, but are not limited to, NANOGLASS® and HOSP® (manufactured by Honeywell International), carbon-doped oxides such as BLACK DIAMOND® (manufactured by APPLIED MATERIALS), CORAL® (manufactured by NOVELLUS), AURORA® (manufactured by ASM), ORION® (manufactured by Trikon), LKD-5109 (manufactured by JSR), and Nano-Clustered Silica or NCS (manufactured by FUJITSU). One characteristic of many nanoporous LKD materials is the presence of an interconnected pore structure, which has a narrow pore size distribution with an average pore size of about 2 nanometers.

Semiconductor substrate 100 can be placed on substrate support 210. Substrate support 210 can include an electrostatic chuck (ESC), mechanical clamp or other clamping mechanism and one or more heating elements for heating semiconductor substrate 100 to a temperature up to 300° C.

Chemical vapor delivery systems 220A, 220B, 220C can be used to sequentially deliver a catalyst, an alkoxysilane repair agent and an alkoxysilane sealing agent, respectively, to process chamber 200. Vacuum pump 240 can be used to evacuate gases from process chamber 200 once treatment with the catalyst, alkoxysilane repair agent or alkoxysilane sealing agent has been completed. The static gas pressure is maintained in process chamber 200 by backpressure regulator 250, which functions to release the vapor into a chemical abatement system when the gas pressure exceeds a preselected pressure.

Figure 5B:
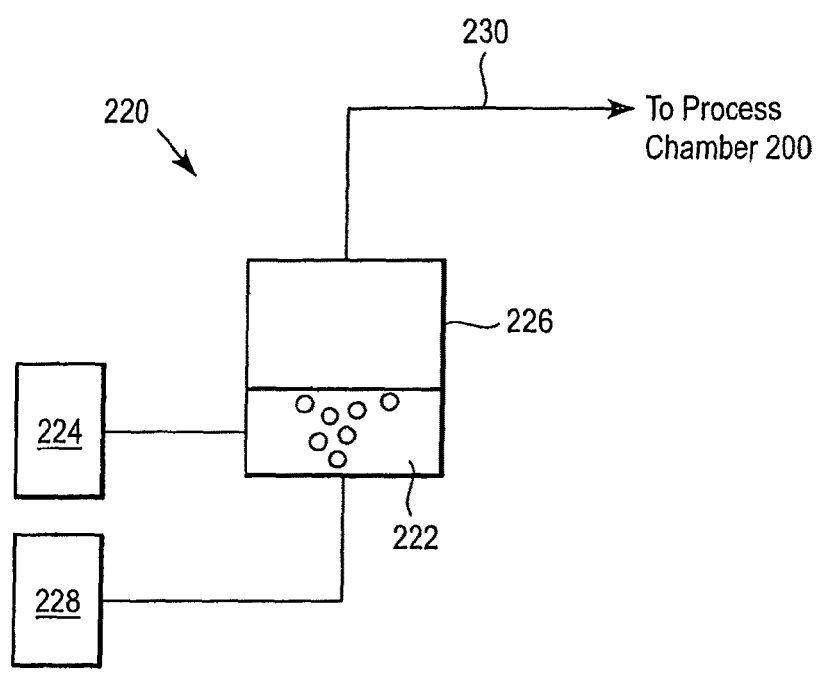
FIG. 5B illustrates a chemical vapor delivery system for the vaporization and delivery of a liquid agent.

FIG. 5B illustrates an embodiment of chemical vapor delivery system 220 for a liquid agent (e.g., catalyst, alkoxysilane repair agent or alkoxysilane sealing agent). Liquid agent 222 from agent source 224 can be placed in bubbler 226, which is heated to an elevated temperature to vaporize the liquid agent 222. An inert gas (e.g. nitrogen or argon) from gas source 228 bubbles through the liquid agent 222 to deliver the vaporized agent to process chamber 200 through gas line 230. Gas line 230 can be heated to prevent the condensation of the vaporized agent within the gas line 230.

Semiconductor substrate 100 is placed in contact with a vapor-phase catalyst prior to any repair and/or sealing process. As described above, the Lewis base amine or organic acid catalyst functions to kinetically enhance the rate of condensation between alkoxysilanes and Si—OH groups without the primary hydrolysis step in the case of the Lewis base amine catalyst, and by accelerating hydrolysis in the case of the organic acid. The temperature of process chamber 200 and substrate support 210 can be heated to a first temperature of about 60° C. to about 275° C., preferably about 100° C. to about 200° C. To prevent condensation of any vapor-phase agents, the temperature of the semiconductor substrate 100 is preferably maintained at a temperature higher than the temperature of the vapor-phase agent throughout the entire process.

Initially, the pressure of process chamber 200 is maintained at a vacuum pressure to facilitate vaporization of the catalyst (e.g., about 0.5 Torr to about 10 Torr). Chemical vapor delivery system 220A delivers a vapor-phase catalyst to the process chamber 200 to treat semiconductor substrate 100. Semiconductor substrate 100 is placed in contact with the vapor-phase catalyst in an amount effective to interact with silanol groups in the etch damaged region. For example, the vapor-phase catalyst can form a sub-monolayer or monolayer of the catalyst on the exterior surfaces of opening 130 (i.e., sidewall surfaces) and on interior surfaces of the interconnected pores in the nanoporous LKD material 110. In one embodiment, a plasma damaged region can extend to depth to about 30 nm into the sidewalls of the openings 130.

In one embodiment, the catalyst is delivered to the process chamber 200 to increase static pressure of the vapor-phase catalyst in process chamber 200 to about 20 Torr to about 1500 Torr (i.e., about 2 bars), preferably about 100 Torr to about 760 Torr. The volume of process chamber 200 is about 1.1 liters. The contact time of the vapor-phase catalyst can be about 10 seconds to about 60 seconds, preferably about 20 to about 30 seconds. After treatment with the vapor-phase catalyst has been completed, the remaining vapor-phase catalyst is removed from the process chamber 200 either by dynamic flow of an inert gas or by vacuum pump 240, until a pressure of below about 5 Torr is achieved. In another embodiment, a dynamic vacuum can be maintained by flowing the vapor-phase catalyst into processing chamber during the simultaneous operation of vacuum pump 240 and/or a back pressure regulator 250.

Exemplary Lewis base amines can include ammonia ($NH_3$), methyl amine ($CH_3NH_2$), dimethyl amine (($CH_3$)$_2$NH) or trimethyl amine (N($CH_3$)$_3$), or corresponding primary, secondary, or tertiary ethyl substituted amines. Exemplary organic acids can include acetic acid, trifluoroacetic acid, trichloroacetic acid, citric acid, other fully halogenated or partially halogenated weak acids. In one embodiment, the organic acid can be mixed with water to form an aqueous solution, which is vaporized. Depending upon the specific Lewis base amine or organic acid, the temperature of the process chamber 200 and substrate support 210 and static pressure is selected to prevent condensation of the Lewis base amine catalyst or organic acid. If an organic acid catalyst is used, to maximize alkoxysilane reactions with surface-bound Si—OH groups, excess vapor phase organic acid is preferably evacuated before the introduction of alkoxysilane repair and/or sealing agents, to prevent reactions between the organic acid and alkoxysilane in the vapor phase.

After treatment with the vapor-phase catalyst has been completed, the pressure of the process chamber 200 is decreased to a vacuum pressure to facilitate vaporization of the alkoxysilane repair agent (e.g., about 0.5 Torr to about 10 Torr). Process chamber 200 can be optionally backfilled with an inert gas (e.g., nitrogen or argon) before evacuating to a vacuum pressure. The temperature of process chamber 200 and substrate support 210 is maintained at the first temperature of about 60° C. to about 275° C., preferably about 100° C. to about 200° C. Chemical vapor delivery system 220B delivers the alkoxysilane repair agent to the process chamber 200 to treat semiconductor substrate 100. Semiconductor substrate 100 is placed in contact with the alkoxysilane repair agent in an amount effective to restore at least 50% of the lost methyl groups with an alkyl group (e.g., ethyl, propyl, butyl groups), preferably about 75% to about 90% of the lost methyl groups.

In one embodiment, a fixed amount of alkoxysilane repair agent is delivered such that the static pressure of repair agent in process chamber 200 is about 20 Torr to about 1500 Torr (i.e., about 2 bars), preferably about 100 Torr to about 760 Torr. The total contact time of semiconductor substrate 100 with the vapor-phase alkoxysilane repair agent at the first temperature can be about 10 seconds to about 180 seconds, preferably about 20 seconds to about 60 seconds. In another embodiment, a dynamic vacuum can be maintained by flowing the vapor-phase repair agent into processing chamber 200 during the simultaneous operation of vacuum pump 240 and/or a back-pressure regulator 250.

To increase the reactivity of the alkoxysilane repair agent with the silanol groups in the bulk of the nanoporous LKD material 110, after contact with the alkoxysilane repair agent at a first temperature has been completed, the nanoporous LKD material 110 is preferably placed in contact with the alkoxysilane repair agent at a second temperature. The temperature of the wafer support 210 can be increased from the first temperature to a second temperature of about 80° C. to about 300° C., preferably about 150° C. to about 250° C. The total contact time of semiconductor substrate 100 with the vapor-phase alkoxysilane repair agent at the second temperature can be about 10 seconds to about 180 seconds, preferably about 20 seconds to about 60 seconds.

Exemplary alkoxysilane repair agents can include methyl trimethoxysilane ($CH_3$—Si—(O—$CH_3$)$_3$), dimethoxy dimethylsilane (($CH_3$)$_2$—Si—($OCH_3$)$_2$), methoxy trimethylsilane (($CH_3$)$_3$—Si—$OCH_3$) or n-propyl trimethoxysilane ($CH_3$—$CH_2$—$CH_2$—Si—($OCH_3$)$_3$ or n-PTMS). Depending upon the specific alkoxysilane repair agent, the temperature of the process chamber 200 and substrate support 210 and static pressure is selected to prevent condensation of the alkoxysilane repair agent. Condensation of the alkoxysilane repair agent on the surface of the LKD material can be detrimental, preventing the uniform penetration of the alkoxysilane repair agent into the nanoporous LKD material. To ensure that the agent is in its vapor state, the nanoporous LKD material is placed in contact with an agent below its saturation point (i.e., vapor pressure at a given temperature is less than 760 Torr). Under these conditions, no saturation (i.e., formation of liquid agent) can occur on the nanoporous LKD material.

For removal of excess agents and reaction by-products from semiconductor substrate 100, the pressure of vacuum chamber is decreased to about 0.5 Torr for about 30 seconds to about 180 seconds. Alternatively, the pressure in the chamber can be maintained at a static level and a dynamic flow of an inert flush gas can be used to remove the residual agent.

If desired, the above described process steps for contacting the vapor-phase catalyst and vapor-phase alkoxysilane repair agent with the nanoporous LKD material can be repeated one or more times on the same semiconductor substrate 100 at the second temperature to increase the reactivity of the alkoxysilane repair agent. For example, contacting the vapor-phase catalyst and the alkoxysilane repair agent with the nanoporous LKD material can be repeated up to ten times.

Once treatment with the vapor-phase repair agent has been completed, the surface of the LKD material 110 can be sealed by contacting semiconductor substrate 100 with an alkoxysilane sealing agent. As described above, this sealing step covers the sidewall and bottom surfaces of the openings with an alkoxysilane film with a thickness of up to about 2 nm, effective to prevent the diffusion of an overlying barrier material into the interconnected pores of the nanoporous LKD material. The LKD material 110 can be optionally placed in contact with the vapor-phase catalyst prior to the sealing process.

The process of sealing is identical to the repair process described above, including treatment with the vapor-phase catalyst. However, an alkoxysilane sealing agent is used in place of the alkoxysilane repair agent. Exemplary alkoxysilane sealing agents can include bis(dimethoxymethyl)siloxane, bis(methyldimethoxysilylpropyl)-N-methylamine, bis(triethoxysilyl)ethane, 1,2-bis(trimethoxysilyl) hexane, bis(trimethoxysilylpropyl)amine or bis(3-(triethoxysilyl)propyl)disulfide.

The surface of the LKD material 110 can be sealed by contacting the surface with an alkoxysilane sealing agent without an initial repair step, if plasma damage to the sidewalls and bottom of opening 130 is minimal and repair is not desired. In this instance, the semiconductor substrate 100 and LKD material 110 would be placed in contact with the vapor-phase catalyst prior to the sealing process.

If desired, after the repair and/or sealing process has been completed, the alkoxysilane compounds can be horizontally networked to form three-dimensional horizontally networked structures, restoring the mechanical strength of the nanoporous LKD material. This horizontal networking step can be preformed by treating the LKD material with the organic acid (e.g., acetic acid, trifluoroacetic acid, trichloroacetic acid, citric acid) described above to catalyze a hydrolytic reaction between water and the residual alkoxy groups, as illustrated in FIG. 4. In a preferred embodiment, the organic acid vapor can be delivered to process chamber 200 using the chemical vapor delivery system 220 with the temperature range, pressure range and time range described above. The LKD material is placed in contact with a vapor phase catalyst in an amount effective to horizontally network the alkoxysilane repair and/or sealing agents.

After treatment with the organic acid vapor has been completed, the temperature of the semiconductor substrate 100 is increased to about 200° C. to about 300° C. for about 60 seconds to about 360 seconds. This heating step facilitates condensation reaction between adjacent alkoxysilane molecules to form three-dimensional horizontally networked structures, restoring the mechanical strength of the nanoporous LKD material. This heating step can either occur inside process chamber 200 or semiconductor substrate 100 can be removed and heated on a hot plate.

Upon the completion of vapor-phase repair and sealing, semiconductor substrate 100 can be subjected to subsequent damascene processing steps, including the deposition of barrier layer 140 in opening 130, formation of bulk metal layer 150 in opening 130 and planarization of the entire structure, as illustrated in FIGS. 1B-1D. The vapor-phase sealing of the sidewall and bottom surfaces of opening 130 in nanoporous LKD material 110 prevents the materials used in forming barrier layer 140 (e.g., Ti, TiN, Ta, TaN, Ru or $RuO_x$) from penetrating into the interconnected pores of nanoporous LKD material 110. Vapor-phase repair and sealing of nanoporous LKD material layer 110 creates a more robust structure that can withstand further mechanical processing steps, including CMP.

EXAMPLE 1

In an exemplary embodiment, semiconductor substrate 100 with an etch damaged nanoporous LKD material 110 is repaired using vapor-phase methyl trimethoxysilane ($CH_3$—Si—(O—$CH_3$)$_3$) as a repair agent and vapor-phase diethyl amine (($CH_3$)$_2$NH) as a catalyst.

Semiconductor substrate 100 with an etch damaged low-k dielectric layer 110 is placed on substrate support 210 of process chamber 200. The process chamber 200 is evacuated to a pressure below 50 Torr and the substrate support 210 and process chamber 200 are heated to a first temperature of about 100° C. Diethyl amine vapor is delivered to process chamber 200 to a static pressure of 700 Torr from chemical vapor delivery system 220A. The semiconductor substrate 100 is placed in contact with the diethyl amine vapor for about 20 seconds.

After the diethyl amine vapor treatment has been completed, the vapor is evacuated with vacuum pump 240 under a dynamic vacuum to reduce the pressure of the process chamber 200 to about 5 Torr or less, to remove residual amine and to facilitate vaporization of the methyl trimethoxysilane, which is a liquid under ambient conditions.

Methyl trimethoxysilane vapor ($CH_3$—Si—(O—$CH_3$)$_3$) is flowed into process chamber 200 from chemical vapor delivery system 220B until a static pressure of 400 Torr is achieved. Semiconductor substrate 100 is placed in contact with the vapor-phase methyl trimethoxysilane for about 20 seconds at the first temperature of about 100° C.

The temperature of substrate support 210 is increased from the first temperature of about 100° C. to a second temperature of about 150° C. and the semiconductor substrate 100 is placed in contact with the vapor-phase methyl trimethoxysilane for an additional 30 seconds.

After the methyl trimethoxysilane vapor treatment has been completed, the vapor is evacuated with vacuum pump 240 under a dynamic vacuum to reduce the pressure of the process chamber 200 to about 0.5 Torr or less for about 60 seconds, to remove excess methyl trimethoxysilane vapor and reaction by-products.

EXAMPLE 2

In another embodiment, semiconductor substrate 100 with an etch damaged nanoporous LKD material 110 is sealed using vapor-phase bis(3-methyldimethoxysilyl-propyl)-N-methylamine as a sealing agent with vapor-phase methyl amine ($CH_3NH_2$) as a catalyst.

Semiconductor substrate 100 with an etch damaged low-k dielectric layer 110 is placed on substrate support 210 of process chamber 200. The process chamber 200 is evacuated to a pressure below 50 Torr and substrate support 210 and process chamber 200 are heated to a first temperature of about 150° C. Methyl amine vapor is delivered into process chamber 200 to a static pressure of 1800 Torr from chemical vapor delivery system 220A. The semiconductor substrate 100 is placed in contact with the methyl amine vapor for about 60 seconds.

After the methyl amine vapor treatment has been completed, the vapor is evacuated with vacuum pump 240 under a dynamic vacuum to reduce the pressure of the process chamber 200 to about 300 Torr or less.

Flowing bis(3-methyldimethoxysilyl-propyl)-N-methylamine is introduced into process chamber 200 from chemical vapor delivery system 220C with dry nitrogen as a carrier gas at approximately 3000 sccm. The pressure is maintained to 400 Torr by the simultaneous operation of vacuum pump 240. Semiconductor substrate 100 is placed in contact with flowing bis(3-methyldimethoxysilyl-propyl)-N-methylamine for about 180 seconds at about 150° C.

After the bis(3-methyldimethoxysilyl-propyl)-N-methylamine vapor treatment has been completed, the vapor is evacuated with vacuum pump 240 under a dynamic vacuum to reduce the pressure of the process chamber 200 to about 2 Torr or less for about 60 seconds.

EXAMPLE 3

Silicon substrate samples with an overlying nanoporous LKD material (JSR LKD-5109, manufactured by JSR Corporation) were prepared. The samples were coated with photoresist, patterned and subjected to reactive ion etching (RIE) to form trenches, followed by oxygen ashing to remove the photoresist. The RIE and photoresist removal result in a plasma damaged region surrounding the etched openings in the patterned areas.

A first sample with a plasma damaged JSR LKD-5109 layer was placed in contact with a vapor phase trifluoroacetic acid catalyst prior to contact with a vapor-phase n-propyl trimethoxysilane (n-PTMS) repair agent. A second sample with a plasma damaged JSR LKD-5109 layer was treated with an n-PTMS repair agent and a trifluoroacetic acid catalyst dissolved in supercritical $CO_2$ ($SCCO_2$). A third sample was a control sample with an unrepaired plasma damaged JSR LKD-5109 layer. A fourth sample is another control sample with an as-deposited JSR LKD-5109 layer (i.e., not subjected to plasma etching). Samples were analyzed by scanning electron microscopy (SEM) to characterize the degree of repair along the sidewalls of the etched trenches and secondary ion mass spectrometry (SIMS) to characterize the ratio of carbon to silicon over the surface of the JSR LKD-5109 layer to a depth of about 150 nm.

The first sample containing the plasma etch damaged JSR LKD-5109 was placed on substrate support 210 of process chamber 200. The process chamber 200 was evacuated to a pressure below 50 Torr and the substrate support 210 and process chamber 200 are heated to a first temperature of about 135° C. A 3:1 mixture of trifluoroacetic acid to water was vaporized and introduced into process chamber 200 to a pressure of 900 Torr from chemical vapor delivery system 220A. The first sample was placed in contact with the trifluoroacetic acid vapor for about 120 seconds before process chamber 200 was backfilled with nitrogen and evacuated. Vapor-phase n-PTMS repair agent was delivered into process chamber 200 by chemical vapor delivery system 220B to treat the second sample for about 5 minutes at a static pressure of about 1000 Torr. The process chamber 200 was backfilled with nitrogen gas and the first sample was maintained at a temperature of 135° C. for about 2 minutes. The first sample was then removed from the process chamber and heated on a hotplate from about 120 seconds at about 250° C.

The second sample was placed in a heated pressure vessel (i.e., about 140° C.) which was subsequently sealed and pressurized to about 97,500 Torr (about 130 bar) with supercritical carbon dioxide ($SCCO_2$). A 3:1 mixture of trifluoroacetic acid to water was added using a high-pressure injection loop by pumping additional $SCCO_2$ into the vessel and flushing catalyst into the vessel. The concentration of the catalyst after completion of addition was approximately 1% by volume and the resulting pressure was about 150,000 Torr (about 200 bar) at about 140° C. After a period of about 60 seconds, the $SCCO_2$ solution containing acid catalyst was flushed from the chamber by addition of pure $SCCO_2$. The flushing resulted in approximately 6 fluid turnovers (i.e., the amount of flow for a period of time required to equal the volume of the vessel) over a period of about 2 minutes. After flushing, the pressure in the vessel was reduced to about 97,500 Torr (about 130 bar) at about 140° C. by removal of $SCCO_2$. An n-propyl trimethoxysilane (n-PTMS) repair agent was then added to the vessel using a high-pressure injection loop by pumping additional $SCCO_2$ into the vessel. The concentration of the repair agent was approximately 2% by volume and the final pressure in the vessel was about 150,000 Torr (about 200 bar) at 140° C. After a period of 5 minutes, the vessel was flushed with pure $SCCO_2$ for a period and at a flow rate to allow for 8 fluid turnovers over a period of about 2 minutes. The pressure in the vessel was reduced to ambient and the second sample was removed.

Figure 6A:
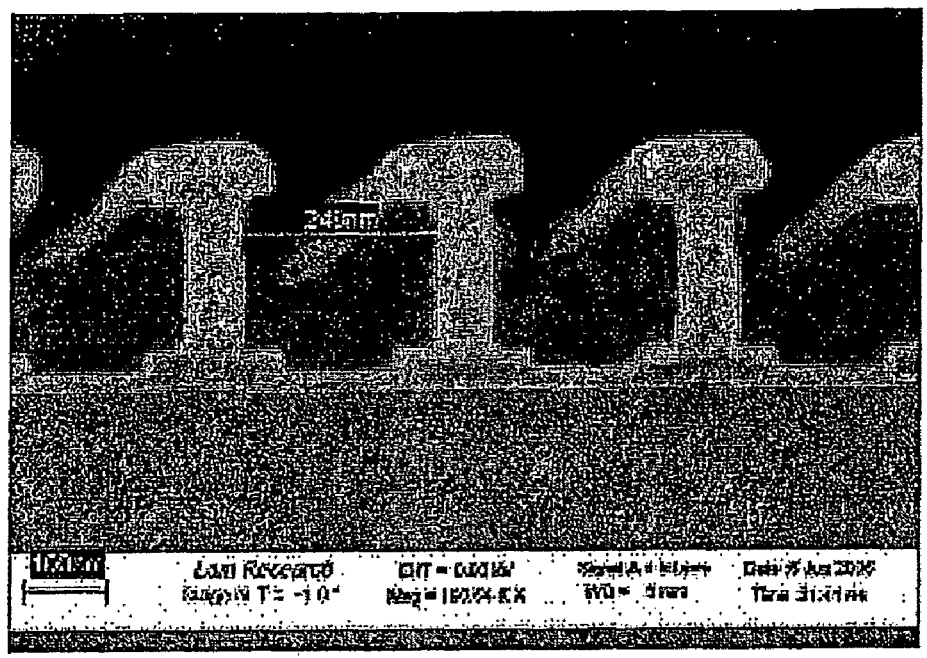
FIGS. 6A-6C are scanning electron microscope (SEM) images characterizing the degree of repair along the sidewall of etched trenches for a vapor phase repaired sample, a supercritical $CO_2$ repaired sample and a sample with no repair.
Figure 6B:
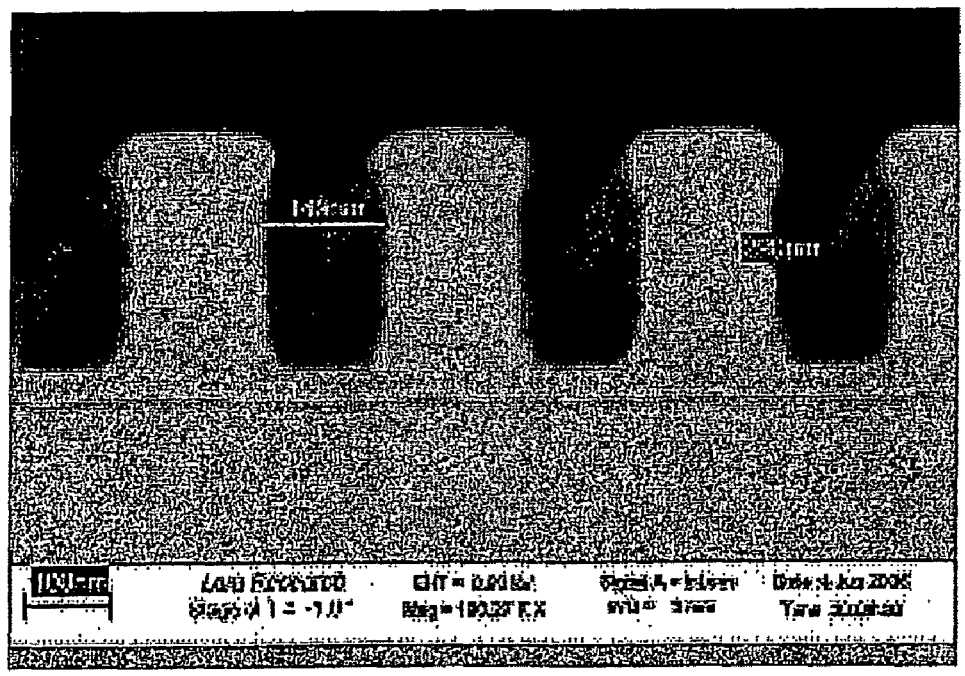
Figure 6C:
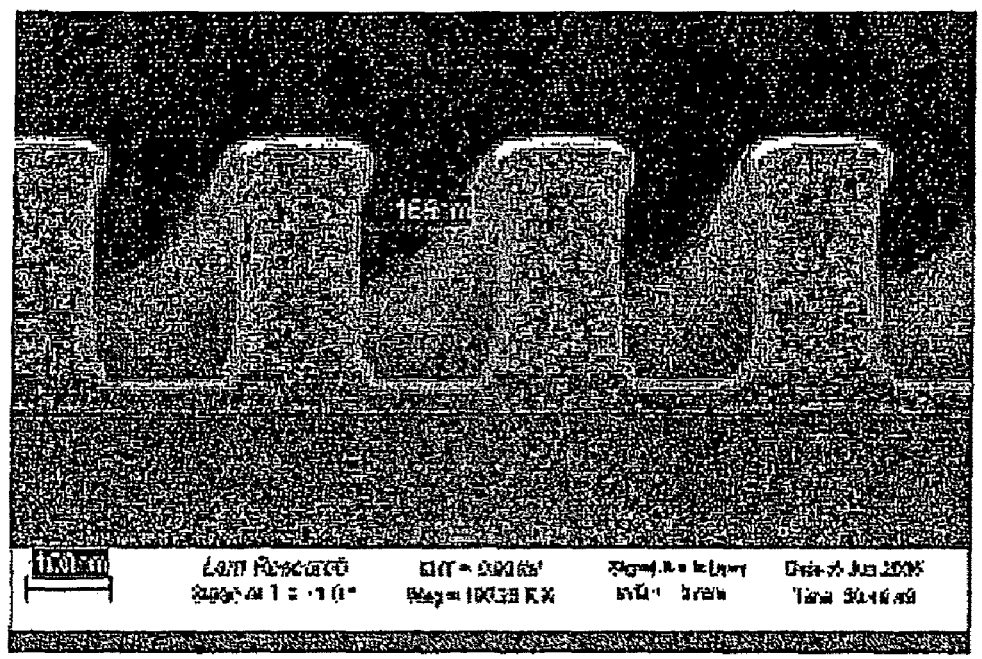

The first sample (i.e., n-PTMS vapor-phase repaired), second sample (i.e., n-PTMS $SCCO_2$ repaired) and third sample (i.e., no repair) were characterized by SEM. Each sample was etched in a 1% HF solution for about 60 seconds and rinsed in deionized water. Because the 1% HF solution preferentially etches Si—OH groups from the nanoporous LKD material, the degree of repair can be quantified by the depth of the undercutting along the sidewall of the trench. FIG. 6A illustrates an SEM image of the first sample (i.e., n-PTMS vapor phase repaired) in which undercutting was measured at a depth of about 11 nm into the sidewall of the trench. FIG. 6B illustrates an SEM image of the second sample (i.e., n-PTMS $SCCO_2$ repaired) in which undercutting was measured at a depth of about 11 nm into the sidewall of the trench. FIG. 6C illustrates an SEM image of the third sample (i.e., no repair), in which undercutting was measured at a depth of about 43 nm into the sidewall of the trench. Thus, FIGS. 6B-6C illustrate that the vapor phase repair is as effective as $SCCO_2$ in repairing etch damaged nanoporous LKD materials.

The first sample (i.e., n-PTMS vapor-phase repaired), second sample (i.e., n-PTMS $SCCO_2$ repaired), third sample (i.e., no repair) and fourth sample (i.e., as deposited JSR LKD-5109) were characterized by SIMS to determine the ratio of carbon to silicon as a function of depth, in which the surface of each sample was sputtered and secondary ions formed during this sputtering were analyzed with a mass spectrometer.

Figure 7:
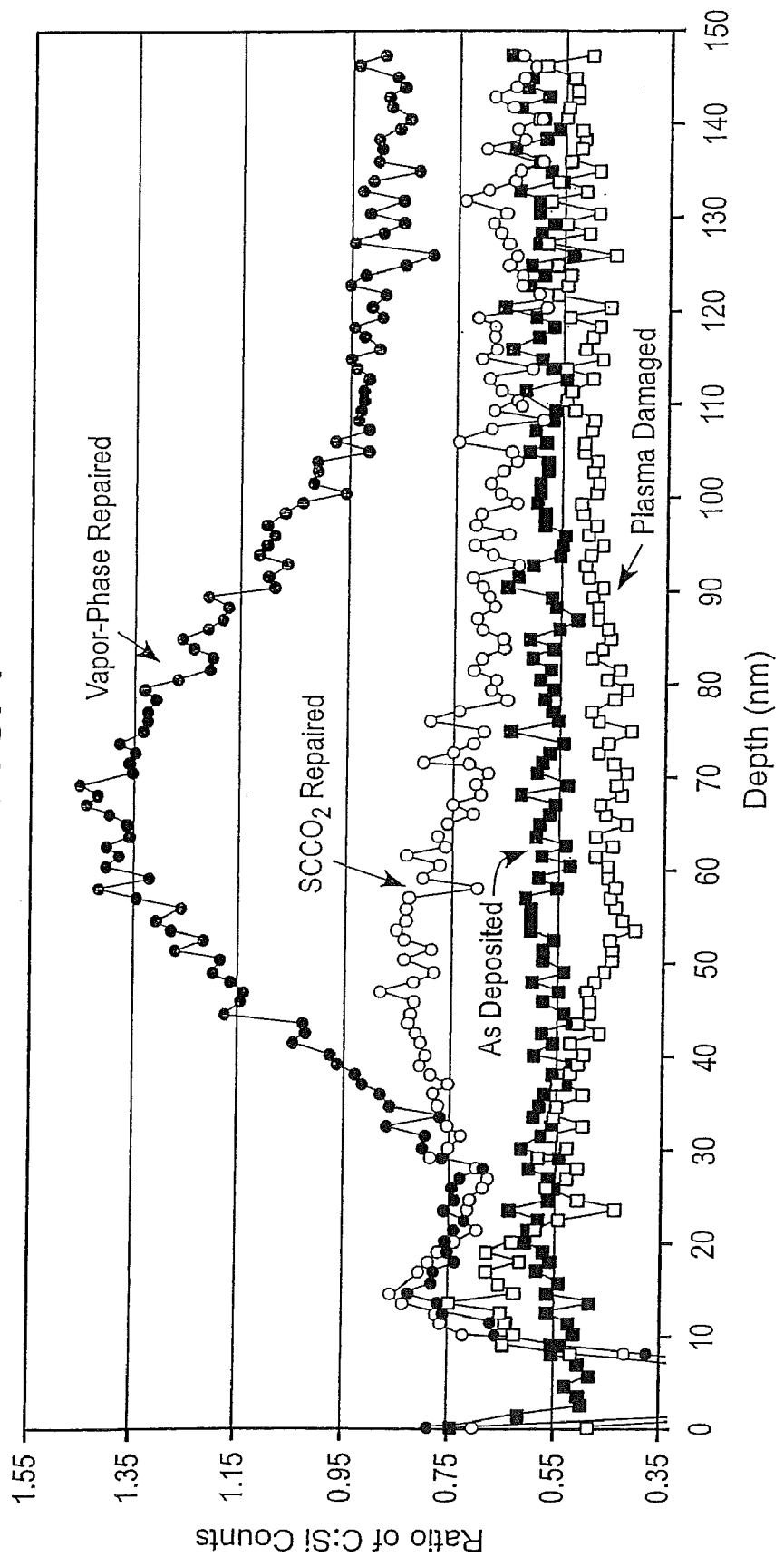
FIG. 7 illustrates the ratio of carbon to silicon as a function of depth from a secondary ion mass spectrometry (SIMS) analysis for a vapor phase repaired sample, a supercritical $CO_2$ repaired sample, a sample with no repair and an as-deposited sample.

As illustrated in FIG. 7, the carbon to silicon ratio of the fourth sample (filled squares in FIG. 7), as-deposited JSR LKD-5109, was about 0.55. For the third sample (open squares in FIG. 7), after etching the trenches and photoresist removal had been completed, the carbon to silicon ratio decreased to about 0.45 to about 0.55. However, for the second sample (open circles in FIG. 7), the carbon to silicon ratio increased to about 0.6 to about 0.8, above the carbon to silicon ratio of the as-deposited JSR LKD-5109. This is because the repair process replaces lost methyl groups ($—CH_3$) with propyl groups ($—C_3H_7$), thus increasing the carbon to silicon ratio in the damaged regions. For the first sample (filled circles in FIG. 7), there is a significant increase in the carbon to silicon ratio of up to about 1.45. This is a possible indication that the vapor-phase repair more effectively densifies n-PTMS and/or sealing of the porous surface.

While the invention has been described in detail with reference to specific embodiments thereof, it will be apparent to those skilled in the art that various changes and modifications can be made, and equivalents employed, without departing from the scope of the appended claims.

What is claimed is:

1. A method of treating a nanoporous low-k dielectric material formed on a semiconductor substrate, the low-k dielectric material having etched openings with an etch damaged region containing silanol groups on exterior surfaces of the etched openings and on interior surfaces of interconnected pores, comprising:
   (a) contacting the low-k dielectric material with a vapor phase catalyst in an amount effective to form hydrogen bonds between the catalyst and the silanol groups in the etch damaged region, forming a catalytic intermediary, followed by: at least one of
   (b) contacting the low-k dielectric material with a vapor phase alkoxysilane repair agent in an amount effective to react with about 50% or more of the silanol groups in the etch damaged region, such that the alkoxysilane repair agent reacts with the catalytic intermediary; and
   (c) contacting the low-k dielectric material with a vapor phase alkoxysilane sealing agent in an amount effective to prevent diffusion of an overlying barrier layer into the interconnected pores, such that the alkoxysilane sealing agent reacts with the catalytic intermediary.

2. The method of claim 1, wherein: (i) the catalyst is a Lewis base amine or an organic acid; (ii) step (a) and step (b) are repeated up to ten times prior to step (c); (iii) the sealing agent forms an alkoxysilane film up to 2 nm in thickness on the exterior surfaces of the etched openings; and/or the alkoxysilane repair agent has an atom mass unit of about 80 to about 125 and the alkoxysilane sealing agent has an atomic mass unit of about 200 to about 400.

3. The method of claim 2, wherein the Lewis base amine is ammonia ($NH_3$), methyl amine ($CH_3NH_2$), dimethyl amine ($(CH_3)_2NH$) or trimethyl amine ($N(CH_3)_3$); or the organic acid is an aqueous solution of acetic acid, trifluoroacetic acid, trichloroacetic acid or citric acid.

4. The method of claim 2, further comprising after step (a) and before step (b) removing the organic acid vapor phase catalyst from the low-k dielectric material to prevent vapor phase reactions between: (i) the organic acid vapor phase catalyst and (ii) least one of the alkoxysilane repair agent and/or and the alkoxysilane sealing agent.

5. The method of claim 4, wherein the alkoxysilane repair agent is methyl trimethoxysilane ($CH_3—Si—(O—CH_3)_3$), dimethoxy dimethylsilane ($(CH_3)_2—Si—(OCH_3)_2$), methoxy trimethylsilane ($(CH_3)_3—Si—OCH_3$) or n-propyl trimethoxysilane ($CH_3—CH_2—CH_2—Si—(OCH_3)_3$); and the alkoxysilane sealing agent is bis(dimethoxymethyl)siloxane, bis(methyldimethyloxysilylpropyl)-N-methylamine, bis(triethoxysilyl)ethane, 1,2-bis(trimethoxysilyl)hexane, bis(trimethoxysilylpropyl)amine or bis(3-(triethoxysilyl)propyl) disulfide.

6. The method of claim 1, further comprising repeating step (a) prior to step (c).

7. The method of claim 1, wherein (a) contacting the low-k dielectric material with the vapor phase catalyst comprises:
placing the semiconductor substrate in a processing chamber and evacuating the processing chamber;
heating the semiconductor substrate to a first temperature of about 60° C. to about 275° C.;
introducing the catalyst into the chamber at a pressure of about 20 Torr to about 1500 Torr for a time of about 10 seconds to about 60 seconds; and
evacuating the chamber.

8. The method of claim 7, wherein the first temperature is about 100° C. to about 200° C., the pressure is about 100 Torr to about 760 Torr and the time is about 20 seconds to about 30 seconds.

9. The method of claim 7, wherein (b) contacting the low-k dielectric material with the vapor phase alkoxysilane repair agent or (c) contacting the low-k dielectric material with the vapor phase alkoxysilane sealing agent comprises:
heating the semiconductor substrate to a first temperature of about 60° C. to about 275° C.;
introducing the vapor phase alkoxysilane repair agent or the vapor phase alkoxysilane sealing agent into the chamber at a pressure of about 20 Torr to about 1500 Torr for a time of about 10 seconds to about 180 seconds; and
evacuating the chamber.

10. The method of claim 9, wherein the first temperature is about 100° C. to about 200° C., the pressure is about 100 Torr to about 760 Torr and the time is about 20 seconds to about 60 seconds.

11. The method of claim 9, wherein (b) contacting the low-k dielectric material with the vapor phase alkoxysilane repair agent or (c) contacting the low-k dielectric material with the vapor phase alkoxysilane sealing agent further comprises:
heating the semiconductor substrate to a second temperature of about 80° C. to about 300° C. for an additional time of about 10 seconds to about 180 seconds before evacuating the chamber; and maintaining the semiconductor substrate at the second temperature for about 10 seconds to about 180 seconds after evacuating the chamber.

12. The method of claim 11, wherein the second temperature is about 150° C. to about 250° C. and the additional time is about 20 seconds to about 60 seconds.

13. The method of claim 7, further comprising:
(d) contacting the low-k dielectric material with an organic acid vapor phase catalyst in an amount effective to horizontally network the vapor phase alkoxysilane repair agent or vapor phase alkoxysilane sealing agent; and
(e) heating the low-k dielectric material to a temperature effective to horizontally network the vapor phase alkoxysilane repair agent or the vapor phase alkoxysilane sealing agent.

14. The method of claim 13, wherein (d) contacting the low-k dielectric material with an organic acid vapor phase catalyst in an amount effective to horizontally network the vapor phase alkoxysilane repair agent or the vapor phase alkoxysilane sealing agent comprises:
heating the semiconductor substrate to a first temperature of about 60° C. to about 275° C.;
introducing the organic acid vapor phase catalyst into the chamber at a pressure of about 20 Torr to about 1500 Torr for a time of about 10 seconds to about 60 seconds; and
evacuating the chamber.

15. The method of claim 13, wherein (e) heating the low-k dielectric material to a temperature effective to horizontally network the vapor phase alkoxysilane repair agent or the vapor phase alkoxysilane sealing agent comprises:
heating the semiconductor substrate to a temperature of about 200° C. to about 300° C. for about 60 seconds to about 180 seconds in the chamber; or removing the semiconductor substrate from the chamber and placing the semiconductor substrate on a hotplate and heating the semiconductor substrate to a temperature of about 200° C. to about 300° C. for about 60 seconds to about 180 seconds.

16. A method of treating a nanoporous low-k dielectric material formed on a semiconductor substrate, the low-k dielectric material having etched openings with an etch damaged region containing silanol groups on exterior surfaces of the etched openings and on interior surfaces of interconnected pores, comprising:
(a) contacting the low-k dielectric material with a vapor phase organic acid catalyst in an amount effective to form hydrogen bonds between the catalyst and the silanol groups in the etch damaged region, forming a catalytic intermediary, followed by: at least one of
(b) contacting the low-k dielectric material with a vapor phase alkoxysilane repair agent in an amount effective to react with about 50% or more of the silanol groups in the etch damaged region, such that the alkoxysilane repair agent reacts with the catalytic intermediary; and
(c) contacting the low-k dielectric material with a vapor phase alkoxysilane sealing agent in an amount effective to prevent diffusion of an overlying barrier layer into the interconnected pores, such that the alkoxysilane sealing agent reacts with the catalytic intermediary.

17. The method of claim 16, wherein the organic acid catalyst is an aqueous solution of acetic acid, trifluoroacetic acid, trichloroacetic acid or citric acid.

18. The method of claim 16, wherein the vapor phase alkoxysilane repair agent is methyl trimethoxysilane ($CH_3$—Si—(O—$CH_3$)$_3$), dimethoxy dimethylsilane (($CH_3$)$_2$—Si—(O$CH_3$)$_2$), methoxy trimethylsilane (($CH_3$)$_3$—Si—O$CH_3$) or n-propyl trimethoxysilane ($CH_3$—$CH_2$—$CH_2$—Si—(O$CH_3$)$_3$); and the vapor phase alkoxysilane sealing agent is bis(dimethoxymethyl)siloxane, bis(methyldimethyloxysilylpropyl)-N-methylamine, bis(triethoxysilyl)ethane, 1,2-bis(trimethoxysilyl)hexane, bis(trimethoxysilylpropyl)amine or bis(3-(triethoxysilyl)propyl)disulfide.

19. The method of claim 16, wherein (a) contacting the low-k dielectric material with a vapor phase organic acid catalyst comprises:
placing the semiconductor substrate in a processing chamber and evacuating the processing chamber;
heating the semiconductor substrate to a first temperature of about 60° C. to about 275° C.;
introducing the vapor phase organic acid catalyst into the chamber at a pressure of about 20 Torr to about 1500 Torr for a time of about 10 seconds to about 60 seconds; and
evacuating the chamber.

20. The method of claim 16, further comprising:
(d) contacting the low-k dielectric material with the vapor phase organic acid catalyst in an amount effective to horizontally network the vapor phase alkoxysilane repair agent or the vapor phase alkoxysilane sealing agent; and
(e) heating the low-k dielectric material to a temperature effective to horizontally network the vapor phase alkoxysilane repair agent or the vapor phase alkoxysilane sealing agent.

* * * * *

UNITED STATES PATENT AND TRADEMARK OFFICE
CERTIFICATE OF CORRECTION

PATENT NO.         : 7,998,875 B2                                        Page 1 of 1
APPLICATION NO.    : 12/746807
DATED              : August 16, 2011
INVENTOR(S)        : James DeYoung It is certified that error appears in the above-identified patent and that said Letters Patent is hereby corrected as shown below:

In the Specification

Column 9, line 23, "diethyl" should read --dimethyl--;

line 30, "Diethyl" should read --Dimethyl--;

line 33, "diethyl" should read --dimethyl--; and line 35, "diethyl" should read --dimethyl--.

Column 11, line 39, "6A" should read --6C--; and line 45, "6C" should read --6A--.

Signed and Sealed this
Fourteenth Day of July, 2015

Michelle K. Lee
*Director of the United States Patent and Trademark Office*